United States Patent
So et al.

(10) Patent No.: US 7,296,186 B2
(45) Date of Patent: Nov. 13, 2007

(54) SYSTEM-ON-CHIP DEVELOPMENT APPARATUS FOR WIRE AND WIRELESS INTERNET PHONE

(75) Inventors: Woon-Seob So, Daejeon (KR); Dae-Hwan Hwang, Daejeon (KR); Bong-Tae Kim, Daejeon (KR)

(73) Assignee: Electronics and Telecommunications Research Institute (KR)

( * ) Notice: Subject to any disclaimer, the term of this patent is extended or adjusted under 35 U.S.C. 154(b) by 533 days.

(21) Appl. No.: 10/856,278

(22) Filed: May 28, 2004

(65) Prior Publication Data

US 2005/0138582 A1    Jun. 23, 2005

(30) Foreign Application Priority Data

Dec. 22, 2003    (KR) .................. 10-2003-0094828

(51) Int. Cl.
G06F 11/00    (2006.01)
(52) U.S. Cl. .................. 714/30; 714/25; 714/31; 714/51
(58) Field of Classification Search .................. 714/25, 714/30, 31, 51
See application file for complete search history.

(56) References Cited

U.S. PATENT DOCUMENTS

| | | | |
|---|---|---|---|
| 6,449,269 B1 | 9/2002 | Edholm | |
| 6,681,354 B2* | 1/2004 | Gupta | 714/725 |
| 2002/0072893 A1* | 6/2002 | Wilson | 703/26 |
| 2003/0041129 A1* | 2/2003 | Appleby-Allis | 709/221 |
| 2003/0048677 A1* | 3/2003 | Muneno | 365/200 |
| 2003/0110306 A1 | 6/2003 | Bailis et al. | |
| 2003/0163798 A1 | 8/2003 | Hwang et al. | |
| 2005/0132226 A1* | 6/2005 | Wheeler et al. | 713/201 |

FOREIGN PATENT DOCUMENTS

KR    1020040041747    5/2004

* cited by examiner

*Primary Examiner*—Scott Baderman
*Assistant Examiner*—Joseph D Manoskey
(74) *Attorney, Agent, or Firm*—Blakely, Sokoloff, Taylor & Zafman

(57) ABSTRACT

The present invention is directed to a system-on-chip development apparatus for wire/wireless Internet telephone. The system-on-chip development apparatus for wire/wireless Internet telephone according to the present invention adds functions indispensable to a RISC core, constructs a core kernel section using a device integrating additional FPGAs available to support additional functions, and provides a plurality of interfaces necessary to an Internet telephone function centering around the core kernel section. With this, the number of necessary component parts can be minimized to facilitate design and simplify the configuration thereof.

9 Claims, 3 Drawing Sheets

SYSTEM-ON-CHIP DEVELOPMENT APPARATUS FOR WIRE AND WIRELESS INTERNET PHONE

CROSS REFERENCE TO RELATED APPLICATION

This application claims priority to and the benefit of Korea Patent Application No. 2003-94828 filed on Dec. 22, 2003 in the Korean Intellectual Property Office, the entire content of which is incorporated herein by reference.

BACKGROUND OF THE INVENTION (a) Field of the Invention

The present invention relates to a system-on-chip development apparatus for wire/wireless Internet phone. More specifically, the present invention relates to a system-on-chip development apparatus that is indispensable to the development of wire/wireless Internet telephones that provide free or inexpensive voice telephone and Internet access functions on the worldwide Internet network.

(b) Description of the Related Art

Conventionally, a separate RISC (Reduced Instruction Set Computer) core to provide an internal processor function, an FPGA (Field Programmable Gate Array) to use the RISC core, and additional PDGAs to develop peripheral devices have been necessarily used in the development of system-on-chips. In addition, a system-on-chip development apparatus for wire/wireless Internet telephone must be independently constructed and limitedly used. Hence, the circuit configuration becomes more complex with a large number of complicated connection lines between the RISC core and the FPGAs which makes signals unstable, and the scale of the system increases with unnecessary functions.

In using an ARM920T RISC core, for example, there are necessarily used one FPGA to use the RISC core in addition to the RISC and a plurality of FPGAs to develop at least one peripheral device. The bus clock frequency for connecting the FPGAs and the RISC core is confined to about 20 to 40 MHz according to the FPGA characteristic. The use of a separate RISC core and FPGAs makes it impossible to perform testing of the RISC core using the maximum clock frequency of the RISC core. This results in difficulty of designing and developing the system-on-chip development apparatus and requires too much time in debugging and development.

SUMMARY OF THE INVENTION

It is an advantage of the present invention to provide a high-quality system-on-chip design and a high-quality development environment with a simple design and configuration by which essential functions to the RISC core are added and the number of component parts can be minimized by using a device integrating additional FPGAs available.

To achieve the advantage of the present invention, the present invention is directed to a system-on-chip development apparatus for wire/wireless Internet telephone that directly connects the Internet through a wire/wireless line and tests developed system-on-chips to verify the function of each system-on-chip.

In one aspect of the present invention, there is provided a system-on-chip development apparatus for wire/wireless Internet telephone that includes: a core kernel section for constructing a logic circuit using a device integrating a RISC (Reduced Instruction Set Computer) microprocessor and an FPGA (Field Programmable Gate Array) provided therein, and processing a protocol according to at least one communication system in hardware or software; a clock section for providing a clock signal necessary for the core kernel section; a reset section for providing a reset signal necessary for the core kernel section; a handset interface being connected to the core kernel section to perform a connection function to connect to a VoIP (Voice over Internet Protocol) handset; a BBP (BaseBand Processor) logic section comprising an FPGA (Field Programmable Gate Array), the BBP logic section being connected to the core kernel section to perform a baseband wireless modem function comprising an FPGA; a memory section being connected to the core kernel section to store a start program, an operation program, user data, and various application programs; a JTAG (Joint Test Action Group) interface being connected to the core kernel section to perform a connection function to connect to another debugging device; and an EIA232 interface being connected to the core kernel section to perform a connection function to connect to a terminal.

The system-on-chip development apparatus for wire/wireless Internet telephone further includes: a POTS (Plain Old Telephone Service) interface performing a connection function to connect to the core kernel section and a POTS telephone; a wireless interface being connected to the BBP logic section to perform a wireless connection function according to a frequency band; a USB (Universal Serial Bus) interface being connected to the core kernel section to perform a connection function to connect to a USB; and an Ethernet interface being connected to the core kernel section, a local bus, and the Ethernet to perform an Ethernet physical layer function, or an Ethernet MAC (Medium Access Control) layer and physical layer function.

In addition, the system-on-chip development apparatus for wire/wireless Internet telephone further includes: a VoIP handset being connected to the handset interface to perform a VoIP telephone function; a POTS telephone being connected to the POTS interface to perform an analog telephone function; a user extension interface being connected to the core kernel section to perform an extension function to construct an additional circuit; and further a keypad and LCD section being connected to the core kernel section to perform a function to communicate with users.

The core kernel section includes: a core section including the RISC microprocessor and a basic control circuit; and a kernel logic section for using an FPGA to construct a logic circuit having an additional function other than the function of the basic control circuit, and controlling an additional peripheral device. The core section includes: a RISC (Reduced Instruction Set Computer) core being connected to the JTAG interface to perform a central processing function of controllers; a reset controller being connected to the reset section to generate and control a reset signal and to supply the reset signal through an advanced host bus; a clock controller being connected to the clock section to generate and control a clock signal and to supply the clock signal through the advanced host bus; an external bus controller being connected to the memory section and the advanced host bus to perform a connection function to connect to an external memory; and a universal asynchronous receiver/transmitter controller being connected to an EIA232 interface and the advanced host bus to control input/output data.

The core section includes: a bus bridge being connected to the advanced host bus to control a bus use right and to extend it to an advanced host bus signal of the kernel logic section; an interrupt processor being connected to the advanced host bus to process internal and external interrupt signals occurring during an execution of programs; a timer and WDT (Watch Dog Timer) being connected to the advanced host bus to receive a reference clock signal from the clock controller and to generate a timing signal; an internal memory for temporarily storing data and programs for an operational speed by the RISC core; and a configuration controller for controlling the whole configuration data of the core kernel section and the logic data of the kernel logic section.

The kernel logic section includes: a direct memory access controller for generating a control signal according to data communication through an advanced peripheral bus bridge connected to the bus bridge; an input/output controller for processing input/output signals used as the control signal through an advanced peripheral bus connected to the advanced peripheral bus peripheral device; a tone module and codec controller being connected to the advanced peripheral bus to control tone generation and codec and to communicate data with the handset interface and the POTS interface; a wireless media access controller being connected to the advanced peripheral bus to process a wireless MAC protocol; an Ethernet media access controller being connected to the advanced peripheral bus to process an Ethernet MAC protocol; a universal serial bus controller being connected to the advanced peripheral bus to provide an interface to connect to a USB port; and a user interface for extending the advanced peripheral surplus to those used by the kernel logic section. The advanced peripheral bus bridge connects the advanced host bus and the advanced peripheral bus to data signals, address signals, and control signals based on a timing of each bus.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENTS

In the following detailed description, only the preferred embodiment of the invention has been shown and described, simply by way of illustration of the best mode contemplated by the inventor(s) of carrying out the invention. As will be realized, the invention is capable of modification in various obvious respects, all without departing from the invention. Accordingly, the drawings and description are to be regarded as illustrative in nature, and not restrictive.

Figure 1:
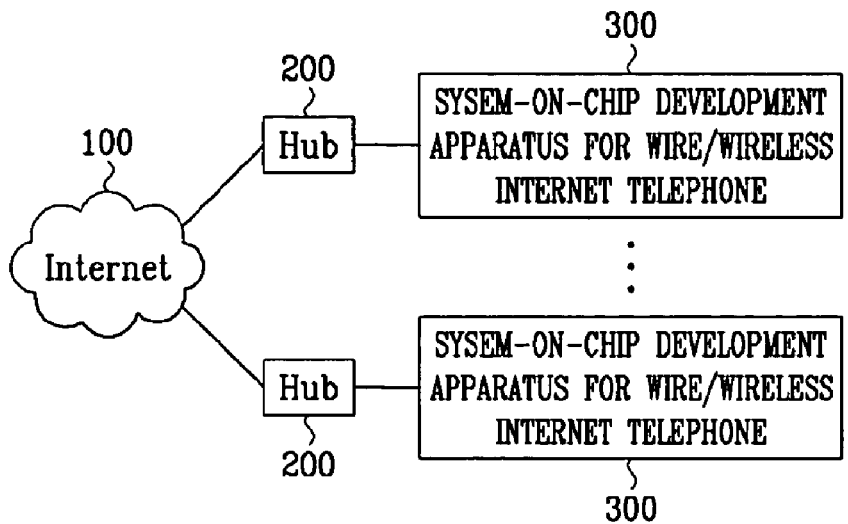
FIG. 1 shows a connection to the Internet of a system-on-chip development apparatus for wire/wireless Internet telephone according to the present invention through a wire line.
Figure 2:
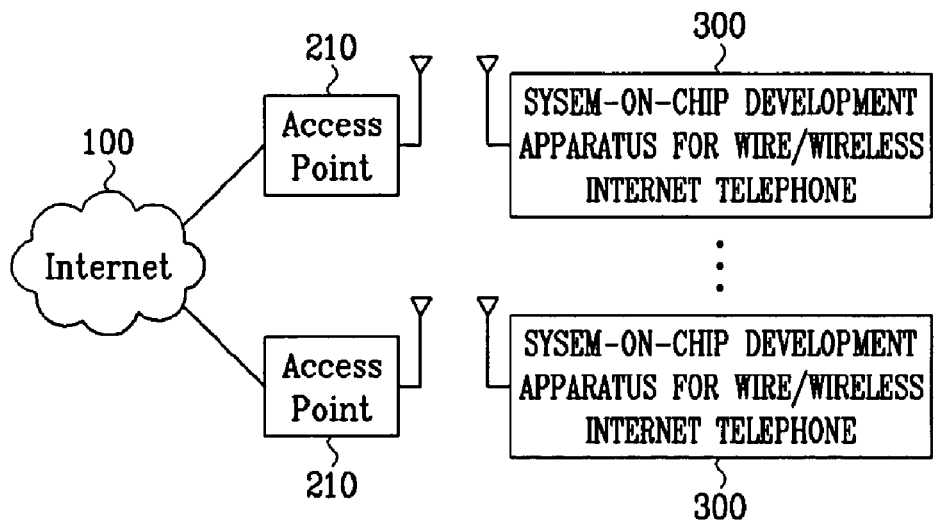
FIG. 2 shows a connection to the Internet of a system-on-chip development apparatus for wire/wireless Internet telephone according to the present invention through a wireless line.

First, a description is given as to a system-on-chip development apparatus for wire/wireless Internet telephone according to an embodiment of the present invention with reference to FIGS. 1 and 2.

FIG. 1 shows a connection to the Internet of a system-on-chip development apparatus for wire/wireless Internet telephone according to the present invention through a wire line, and FIG. 2 shows a connection to the Internet of a system-on-chip development apparatus for wire/wireless Internet telephone according to the present invention through a wireless line.

Referring to FIGS. 1 and 2, the system-on-chip development apparatus 300 for wire/wireless Internet telephone according to an embodiment of the present invention connects to the Internet 100 via a hub 200 or an access point (or wireless LAN equipment) 210 to achieve real-time testing in the actual environment. In this way, most of the functions are tested before the production of system-on-chips, making it possible to develop system-on-chips with reliability.

The system-on-chip development apparatus for wire/wireless Internet telephone according to the embodiment of the present invention is described below in detail with reference to FIG. 3.

Figure 3:
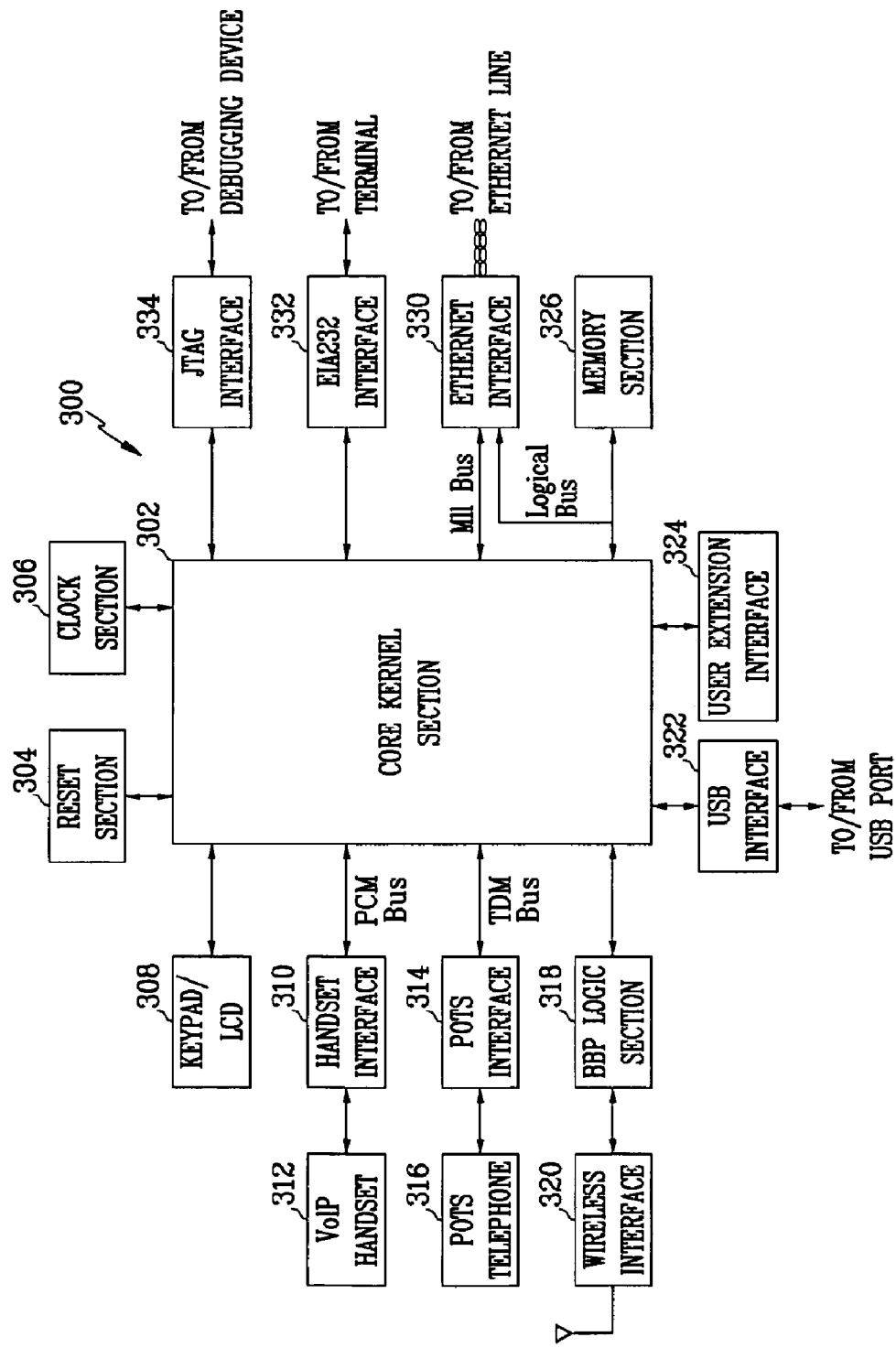
FIG. 3 is a schematic of the system-on-chip development apparatus for wire/wireless Internet telephone according to the present invention.

FIG. 3 is a schematic of the system-on-chip development apparatus for wire/wireless Internet telephone according to the present invention.

The system-on-chip development apparatus 200 for wire/wireless Internet telephone is comprised of respective interface components necessary to the Internet telephone function, centering around a core kernel section 302. The interface components include a clock section 304, a reset section 306, a keypad and LCD section 308, a handset interface 310, a VoIP (Voice over Internet Protocol) handset 312, a POTS (Plain Old Telephone Service) interface 314, a POTS telephone 316, a BBP (BaseBand Processor) logic section 318, a wireless interface 320, a USB interface 322, a user extension interface 324, a memory section 326, an Ethernet interface 330, an EIA232 interface 332, and a JTAG (Joint Test Action Group) interface 334.

The clock section 304 provides clock signals of 50 MHz, 40 MHz, and 32.768 MHz to the system-on-chip development apparatus 300. The clock signals are fed into the core kernel section 302 for frequency demultiplication/multiplication and are transmitted to the respective sections.

The reset section 306 provides a power input reset signal and a switch reset signal to a communication service controller for a required period of time.

The keypad and LCD section 308 is directly connected to the GPIO (General Purpose Input Output) of the core kernel section 302 to provide an external input/output function. The keypad has twelve basic key buttons to dial a telephone number or a special number, and four auxiliary key buttons to provide additional service functions. The auxiliary key buttons include one menu key, one function key, and two control keys. The LCD is connected to the communication service controller through an 8-bit data signal, a write control signal, and a control command data identification signal, to display the status of terminal equipment and necessary user messages. The messages displayed on the LCD include the hook on/off status of the telephone, outgoing/incoming telephone numbers, the current time, etc., which messages can be added or deleted by programming the RISC core of the core kernel section 302.

The handset interface 310 performs a digital-to-analog/analog-to-digital conversion function of various tone signals and voice signals, an amplification function of analog signals, and a speakerphone function using a microphone and a speaker. The handset interface 310 is connected to a tone module and codec controller via a PCM (Pulse Code Modulation) bus, to communicate a TR clock signal PCMCLK, a frame synchronizing signal PFS, a transmit data signal PCMTXD, and a receive data signal PCMRXD.

The VoIP handset 312 is connected to the handset interface 310 to provide a handset function.

The POTS interface 314 performs a ring signal supply function, a tone signal supply function, a DTMF (Dual Tone Multi Frequency) input signal analyzing function, and a voltage converting function necessary for ring signal supply, which functions are activated when a POTS telephone is connected to the Internet network and used as a VoIP telephone. The POTS interface 314 is connected to the tone module and codec controller of the core kernel section 302 via a TDM bus, to communicate a TR clock signal TDM-CLK, a frame synchronizing signal TFS, a transmit data signal TDMTXD, and a receive data signal PDMRXD.

The POTS telephone 316 is an analog telephone generally connected to a public telephone network.

The BBP logic section 318 is connected to the wireless MAC of the core kernel section 302. The BBP function is implemented using additional FPGAs, because the BBP logic section 318 cannot be realized at the kernel logic section of the core kernel section due to its technical complexity and large configuration logic. In the embodiment of the present invention, the BBP logic section 318 is configured to support an OFDM (Orthogonal Frequency Division Multiplexing) modem function of the IEEE 802.g standard and, if necessary, a modem function of the IEEE 802.a, IEEE 802.b, and so forth.

The wireless interface 320 is connected to a radio frequency in the 2.4 GHz or 5 GHz band. The analog signal input to the wireless interface 320 is converted to 10-bit digital data and transmitted to the communication service controller. The 8-bit digital data output from the communication service controller are converted to an analog signal.

The USB interface 322 is connected to a USB controller of the core kernel section 302 to connect a USB device to external equipment. The USB interface 322 comprises a USB transceiver and a connector.

The user extension interface 324 is for extending the external pins and logics in addition to those used to construct the system-on-chip for Internet telephone by the core kernel section 302, so that the user can construct additional logic in the future.

The memory section 326 is directly connected to the external bus controller of the core kernel section 302. It comprises a flash ROM (Read Only Memory) storing a start program or a terminal operation program and being accessible from an 8-, 16-, or 32-bit bus, and a DRAM (Dynamic Random Access Memory) temporarily storing user data or various application programs and being accessible from an 8-, 16-, or 32-bit bus. The memory section 326 is also connected to an external device accessible in the memory-map mode. In the embodiment of the present invention, the memory section can be connected to an external Ethernet device from the Ethernet interface 330.

The Ethernet interface 330 is connected to the core kernel section 302 through an Ethernet MAC and a standard MII (Media Independent Interface) bus to provide a physical layer function of the 10 Base T or 100 Base TX Ethernet. It has an access device connected to the external local bus in the memory-map mode to provide an Ethernet media access controller function and a physical layer function. The MII bus has mutually connected signals, including transmit data signals MTXD3 to MTXD0, a transmit enable signal MTX-ENB, a transmit data clock signal MTXCLX, and a transmit error signal MTXER, and other mutually connected signals, including a receive data signals MRXD3, a receive error signal MRXER, a carrier sense signal MCRS, a collision detection signal MCOL, an interrupt signal MINTR, a control data clock MDC, and a control data signal MDIO. The memory-map type connection includes address signals A1 to A15, data signals D0 to D31, a chip select signal ECS, a data read signal ERD, a data write signal EWR, an interrupt signal EIRQ, byte enable signals EBE0 to EBE3, a data clock signal ECLK, and a reset signal ERESET.

The EIA232 interface 332 is connected to the terminal for debugging through an EIA232 port, and is comprised of a signal level driver and a receiver. The EIA 232 interface 332 has mutually connected signals, including a transmit data signal TXD, a receive data signal RXD, a transmit request signal RTS, and a receive ready signal CTS.

The JTAG interface 334 is connected to the RISC core of the core kernel section 302. It can be connected to a ByteBlasterMV device to program the FPGA hardware of the kernel logic section and debug software programs operated in the RISC core, and also to a Multi-ICE or RealView device to debug software programs only. The mutually connected signals of the JTAG interface 334 include an input data signal TDI, an output data signal TDO, a data clock signal TCK, and a reset signal TRST.

The core kernel section 302 is described in detail with reference to FIG. 4 as follows.

Figure 4:
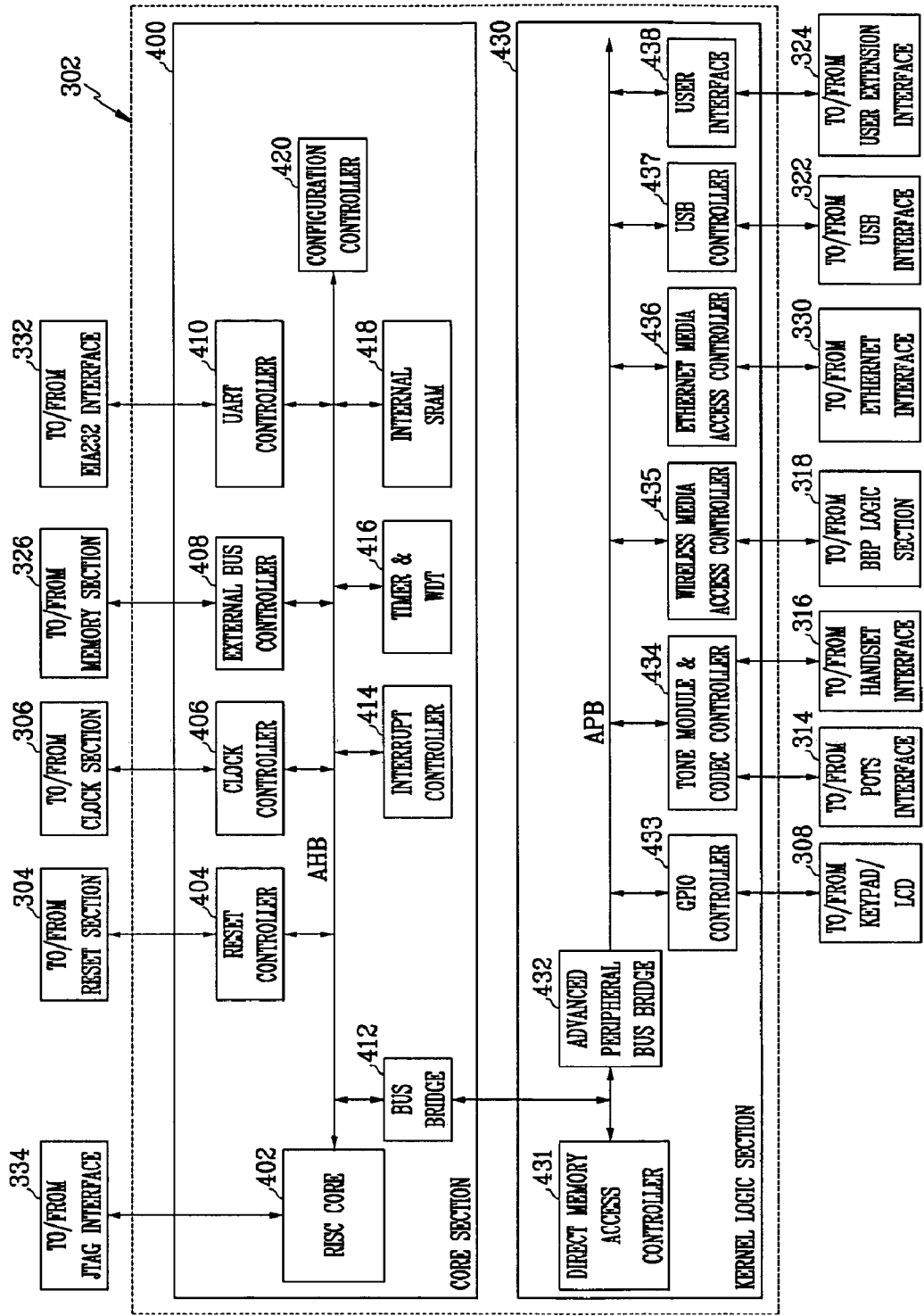
FIG. 4 is a schematic of the kernel core section of FIG. 3.

FIG. 4 is a schematic of the kernel core section 302.

The core kernel section 302 comprises a core section 402, and a kernel logic section 430.

The core section 302 includes an RISC processor, and a basic control circuit. The kernel logic section 430 includes a FPGA to control additional peripheral devices.

To support a control and communication function for the system-on-chip development apparatus 300, the core section 302 comprises a RISC core 402 connected to an AHB (Advanced Host Bus), a reset controller 404, a clock controller 406, an external bus controller 408, a UART (Universal Asynchronous Receiver/Transmitter) controller 410, a bus bridge 412, an interrupt controller 414, a timer & WDT (Watch Dog Timer) 416, an internal SRAM 418, and a configuration controller 420.

The reset controller 404 is connected to the reset section 304, to initialize all the controllers according to external input reset signals, generate reset signals necessary to each controller, and transmit the generated reset signals on the AHB.

The clock controller 406 is connected to the clock section 306, to receive external input clock signals (50 MHz, 40 MHz, and 32.768 MHz) and generate various clock signals necessary to the internal use through a PLL (Phase Lock Loop).

The external bus controller 408 reads data from the memory section 326 to connect to a flash memory or an external dynamic memory, or to timely generate control signals for writing data on the memory section 326.

The UART controller 410 controls input/output data of 230.4 kbps at a maximum to perform EIA232 communication and processes data according to the UART protocol.

The RISC core 402 performs the general CPU (Central Processor Unit) functions as a 32-bit RISC microprocessor, and also a protocol processor function and a communication terminal function according to the communication mode of each section in hardware and software. FPGA is a core part used to construct an additional logic circuit and is connected to the individual sections.

The bus bridge 412 controls the bus use right of each controller connected to the AHB of the core section 400 and extends it to the AHB signal of the kernel logic section 430.

The interrupt controller 414 processes internal and external interrupt signals generated in execution of programs.

The timer & WDT 416 receives a reference clock signal to generate a proper timing signal at a predetermined time, and performs a WDT function to monitor the program execution procedure.

The internal SRAM 418 temporarily stores programs and data rapidly accessibly from the RISC core 402.

The configuration controller 420 has data to set the configuration of the core kernel section 302 and data to construct the logic of the kernel logic section 430.

The kernel logic section 430 comprises a DMA (Direct Memory Access) controller 431, an APB (Advanced Peripheral Bus) bridge 432, a GPIO controller 433, a tone module and codec controller 434, an Ethernet media access controller 436, a wireless media access controller 435, a USB controller 437, and a user interface 438.

The DMA controller 431 is connected to the bus bridge of the core section 400 to generate control signals necessary for rapid data communication between each controller and the memory without intervention of a processor.

The APB bridge 432 connects the bus between AHB and APB to data signals, address signals, and control signals according to the timing of each bus.

The GPIO controller 433 processes input/output signals used as various control signals and usually connects to keypad data input, LCD data output, LED driving signal, and DTMF input signal.

The tone module and codec controller 434 generates 16 DTMF signals, a single tone signal, and melody signals according to the ITU-T Q.23 standard and transmits the generated signals to the handset interface 310 or the POTS interface 316. The tone module and codec controller 434 also performs a function of PCM data communication with the handset interface 310 or a function of TDM data communication with the POTS interface 316.

The wireless media access controller 435 processes the wireless MAC function protocol to support a wireless LAN connection.

The Ethernet media access controller 436 processes the Ethernet MAC function protocol to support a wire Ethernet connection.

The USB controller 437 provides an interface of the USB 1.0 or USB 2.0 standard to support a connection to the USB port.

The user interface 438 extends the APB in addition to those used by the kernel logic section 430, so as to provide an additional function that is externally available.

The kernel logic section 430 further includes an Ethernet physical layer interface 438 to perform a function of conversion between an MAC frame and an Ethernet physical layer frame.

The system-on-chip development apparatus 300 for wire/wireless Internet telephone as constructed above is applicable to a system-on-chip development apparatus directly connected to the Ethernet or connected to the Internet network 100 via a wireless LAN so as to provide a voice telephone function and an Internet access function over the Internet. The system-on-chip development apparatus 300 for wire/wireless Internet telephone is not specifically confined to the above functions, and may perform various functions at the request of the user by simply changing or adding functions. For example, the addition of an image signal processor enables the development of a system-on-chip having an Internet image telephone function and the development of a wireless access point.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

As described above, the present invention adds a function that is indispensable to the RISC core and uses a device integrating additional FPGAs that are available, to minimize the number of necessary component parts, as a result of which a system-on-chip development apparatus for wire/wireless Internet telephone can be designed that can be easily designed with a simple configuration and used in the wire/wireless environment easy to develop system-on-chip development.

In addition, the system-on-chip development apparatus for wire/wireless Internet telephone of the present invention facilitates easy maintenance and repair with reliability due to its simple configuration, and if necessary, allows the use of software of various protocols.

What is claimed is:

1. A system-on-chip development test apparatus comprising:
    a core kernel section for constructing a logic circuit using a device integrating a RISC (Reduced Instruction Set Computer) microprocessor and a FPGA (Field Programmable Gate Array) provided therein, and processing a protocol according to at least one communication system in hardware or software;
    a clock section for providing a clock signal for the core kernel section;
    a reset section for providing a reset signal for the core kernel section;
    a handset interface connected to the core kernel section to perform a connection function to connect to a VoIP (Voice over Internet Protocol) handset;
    a BBP (BaseBand Processor) logic section comprising an FPGA (Field Programmable Gate Array), the BBP logic section being connected to the core kernel section to perform a baseband wireless modem function comprising an FPGA;
    a memory section connected to the core kernel section to store a start program, an operation program, user data, and various application programs;
    a JTAG (Joint Test Action Group) interface connected to the core kernel section to perform a connection function to connect to another debugging device; and
    an EIA232 interface connected to the core kernel section to perform a connection function to connect to a terminal,
wherein the test apparatus operates to test a system-on-chip for verification of functions for a wire/wireless network telephone, which is directly connected to the network through a wire/wireless line and, to test a core section of the core kernel section, the core section including the RISC microprocessor and a basic control circuit.

2. The system-on-chip development apparatus as claimed in claim 1, further comprising:
    a POTS (Plain Old Telephone Service) interface performing a connection function to connect to the core kernel section and a POTS telephone;
    a wireless interface connected to the BBP logic section to perform a wireless connection function according to a frequency band;

a USB (Universal Serial Bus) interface connected to the core kernel section to perform a connection function to connect to a USB; and an Ethernet interface connected to the core kernel section, a local bus, and the Ethernet to perform an Ethernet physical layer function, or an Ethernet MAC (Medium Access Control) layer and physical layer function.

3. The system-on-chip development apparatus as claimed in claim 2, further comprising:

a VoIP handset connected to the handset interface to perform a VoIP telephone function;

a POTS telephone connected to the POTS interface to perform an analog telephone function; and a user extension interface connected to the core kernel section to perform an extension function to construct an additional circuit.

4. The system-on-chip development apparatus as claimed in claim 1, further comprising:

a keypad and LCD section connected to the core kernel section to perform a function to communicate with users.

5. The system-on-chip development apparatus as claimed in claim 1, wherein the core kernel section comprises:

a kernel logic section for using an FPGA to construct a logic circuit having an additional function other than the function of the basic control circuit, and controlling an additional peripheral device.

6. The system-on-chip development apparatus as claimed in claim 2, wherein the core section comprises:

a RISC (Reduced Instruction Set Computer) core connected to the JTAG interface to perform a central processing function of controllers;

a reset controller connected to the reset section to generate and control a reset signal and to supply the reset signal through an advanced host bus;

a clock controller connected to the clock section to generate and control a clock signal and to supply the clock signal through the advanced host bus;

an external bus controller connected to the memory section and the advanced host bus to perform a connection function to connect to an external memory; and a universal asynchronous receiver/transmitter controller connected to an EIA232 interface and the advanced host bus to control input/output data.

7. The system-on-chip development apparatus as claimed in claim 6, wherein the core section comprises:

a bus bridge connected to the advanced host bus to control a bus use right and to extend it to an advanced host bus signal of the kernel logic section;

an interrupt processor connected to the advanced host bus to process internal and external interrupt signals occurring during an execution of programs;

a timer and WDT (Watch Dog Timer) connected to the advanced host bus to receive a reference clock signal from the clock controller and to generate a timing signal;

an internal memory for temporarily storing data and programs for an operational speed by the RISC core; and a configuration controller for controlling the whole configuration data of the core kernel section and the logic data of the kernel logic section.

8. The system-on-chip development apparatus as claimed in claim 7, wherein the kernel logic section comprises:

a direct memory access controller for generating a control signal according to data communication through an advanced peripheral bus bridge connected to the bus bridge;

an input/output controller for processing input/output signals used as the control signal through an advanced peripheral bus connected to the advanced peripheral bus peripheral device;

a tone module and codec controller connected to the advanced peripheral bus to control tone generation and codec and to communicate data with the handset interface and the POTS interface;

a wireless media access controller connected to the advanced peripheral bus to process a wireless MAC protocol;

an Ethernet media access controller connected to the advanced peripheral bus to process an Ethernet MAC protocol;

a universal serial bus controller connected to the advanced peripheral bus to provide an interface to connect to a USB port; and a user interface for extending the advanced peripheral surplus to those used by the kernel logic section.

9. The system-on-chip development apparatus as claimed in claim 8, wherein the advanced peripheral bus bridge connects the advanced host bus and the advanced peripheral bus to data signals, address signals, and control signals based on timing of each bus.

* * * * *